US008516424B2

(12) United States Patent
Tetelbaum et al.

(10) Patent No.: US 8,516,424 B2
(45) Date of Patent: Aug. 20, 2013

(54) TIMING SIGNOFF SYSTEM AND METHOD THAT TAKES STATIC AND DYNAMIC VOLTAGE DROP INTO ACCOUNT

(75) Inventors: Alexander Tetelbaum, Walnut Creek, CA (US); Hyuk-Jong Yi, Breinigsville, PA (US)

(73) Assignee: LSI Corporation, Milpitas, CA (US)

( * ) Notice: Subject to any disclaimer, the term of this patent is extended or adjusted under 35 U.S.C. 154(b) by 66 days.

(21) Appl. No.: 13/246,102

(22) Filed: Sep. 27, 2011

(65) Prior Publication Data

US 2013/0080986 A1 Mar. 28, 2013

(51) Int. Cl.
*G06F 17/50* (2006.01)

(52) U.S. Cl.
USPC ............................ 716/113; 716/108; 716/134

(58) Field of Classification Search
None
See application file for complete search history.

(56) References Cited

U.S. PATENT DOCUMENTS 5,274,568 A * 12/1993 Blinne et al. .................. 716/108
5,692,160 A * 11/1997 Sarin .............................. 703/23
7,222,319 B2 5/2007 Yonezawa
7,239,997 B2 * 7/2007 Yonezawa ....................... 703/19
7,310,792 B2 * 12/2007 Verghese et al. .............. 716/113
7,562,266 B2 * 7/2009 Hosono ......................... 714/700
7,835,888 B2 * 11/2010 Inoue et al. ................... 702/194
8,117,575 B2 * 2/2012 Lu et al. ........................ 716/106
8,281,266 B2 * 10/2012 Jamann et al. ................ 716/108
2004/0167756 A1 * 8/2004 Yonezawa ....................... 703/2
2005/0278671 A1 * 12/2005 Verghese et al. .................. 716/6
2007/0106966 A1 * 5/2007 Inoue et al. ........................ 716/4
2009/0217226 A1 8/2009 Cui et al.
2010/0026378 A1 * 2/2010 Parker et al. .................. 327/538
2011/0138347 A1 6/2011 Tetelbaum

OTHER PUBLICATIONS

Lasbouygues et al., "Temperature- and Voltage-Aware Timing Analysis," IEEE Trans. on CAD of ICs & Systems, vol. 26, No. 4, Apr. 2007, pp. 801-815.*
Sarin, "Deration of Power Dissipated in ASICs With Temperature, Process, and Voltage Variations," 1995 IEEE, pp. 3-6.*
Graziano, Mariagrazia, et al., "Including Power Supply Variations into Static Timing Analysis: Methodology and Flow", 2005 IEEE, pp. 229-232.

* cited by examiner

*Primary Examiner* — Leigh Garbowski

(57) ABSTRACT

A system for, and method of, performing static timing analysis. In one embodiment, the system includes: (1) a CVS tool configured to determine a cell-based voltage supply corresponding to each of a plurality of cells in an integrated circuit design and (2) an STA tool configured to derate the each of the cells based on the corresponding cell-based voltage supply.

20 Claims, 6 Drawing Sheets

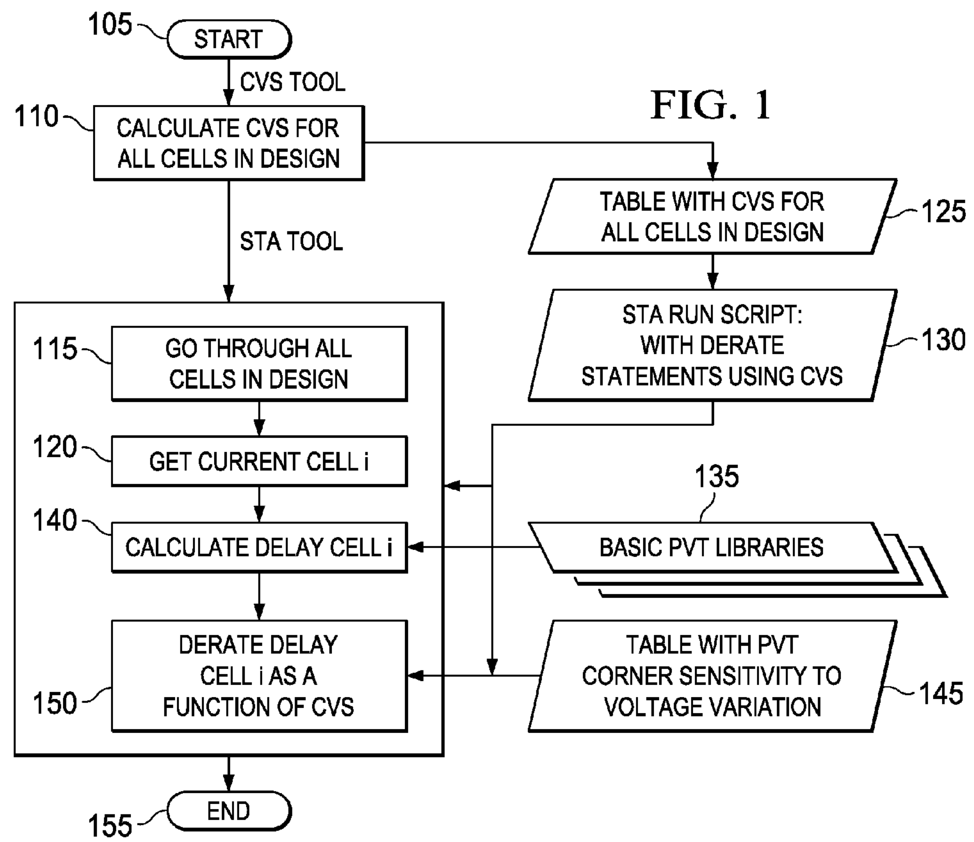
FIG. 1
FIG. 2
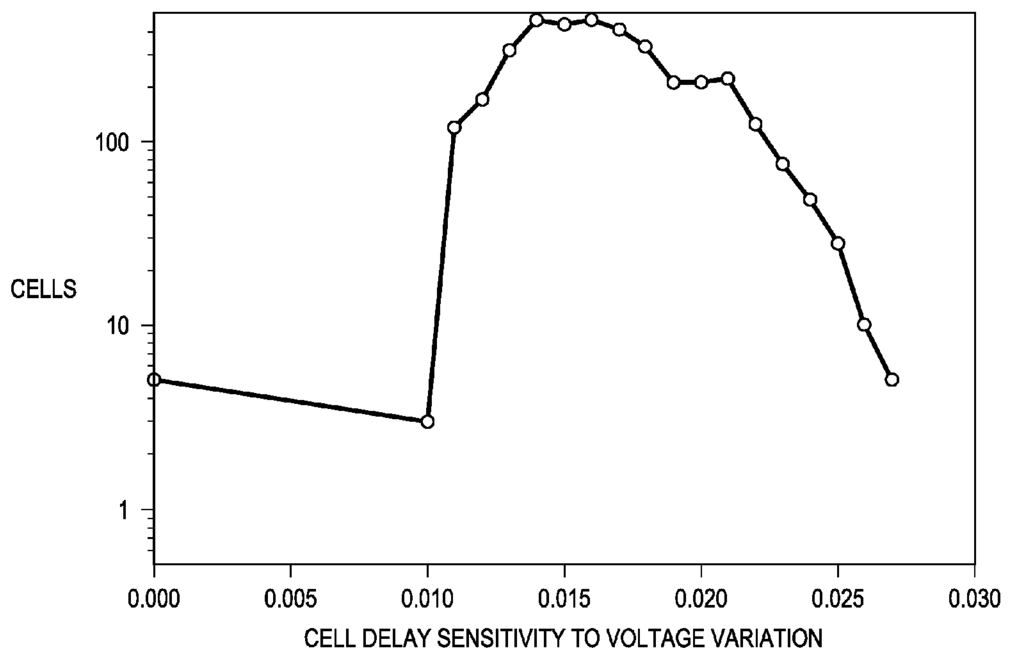

605
START
610
RUN STA AS SHOWN IN FIG_2 OR FIG_4
615
GET ALL CELLS {C} THAT BELONG TO PATHS THAT DO NOT MEET TIMING
620
GO THROUGH EACH CELL C FROM {C}
625
WHAT PATH DOES C BELONG TO?
DATA
CLOCK
NO
CVD>X1?
630
YES
CVD>X2?
NO
645
YES
FIX CVS FOR C
635
FIX CVS FOR C
650
END IF ALL CELLS {C} CONSIDERED
640
END IF ALL CELLS {C} CONSIDERED
655

TIMING SIGNOFF SYSTEM AND METHOD THAT TAKES STATIC AND DYNAMIC VOLTAGE DROP INTO ACCOUNT

TECHNICAL FIELD

This application is directed, in general, to a integrated circuit (IC) design and, more specifically, to a timing signoff system and method that takes static and dynamic voltage drop into account.

BACKGROUND

Circuit designers use electronic design automation (EDA) tools, a category of computer aided design (CAD) tools, to design and lay out electronic circuits, including simulating the operation of the circuit, determining where cells (i.e., logic elements including devices, e.g., transistors) should be placed and where the interconnects that couple the cells together should be routed. EDA tools allow designers to construct a circuit and simulate its performance using a computer and without requiring the costly and lengthy process of fabrication. EDA tools are indispensable for designing modern ICs, particularly very-large-scale integrated circuits (VSLICs). For this reason, EDA tools are in wide use.

One such EDA tool performs timing signoff. Timing signoff is one of the last steps in the IC design process and ensures that signal propagation speed (i.e., delay) in a newly-designed circuit is such that the circuit will operate as intended. Signals that propagate too slowly through the circuit cause setup violations; signals that propagate too quickly through the circuit cause hold violations. Setup or hold violations frustrate the logic of the circuit and prevent it from performing the job it was designed to do.

Timing signoff is performed with highly accurate models of the circuit under multiple sets of assumptions regarding expected variations, called “corners.” Process-voltage-temperature (PVT) corners are based on assumptions regarding variations in device operation from one IC to another, supply voltage and operating temperature. Resistance-capacitance (R, C, or RC) corners are based on assumptions regarding variations in one or both of interconnect resistance and capacitance from one IC to another. Conventional timing signoff identifies setup and hold violations in a “slow” PVT corner (in which process variations are assumed to yield relatively slow-switching devices and supply voltage and operating temperature are such that device switching speed are their slowest) and a “worst” RC corner (in which process variations are assumed to yield interconnects having relatively high resistance and capacitance). Conventional timing signoff also identifies hold violations in a “fast” PVT corner (in which process variations are assumed to yield relatively fast-switching devices and supply voltage and operating temperature are such that device switching speeds are their fastest) and a “best” RC corner (in which process variations are assumed to yield interconnects having relatively low resistance and capacitance). Conventional signoff timing also takes on-chip variations (OCV), which are process variations occurring over the area of a given IC, into account using statistical methods.

SUMMARY

One aspect provides a system for performing static timing analysis. In one embodiment, the system includes: (1) a CVS tool configured to determine a cell-based voltage supply corresponding to each of a plurality of cells in an integrated circuit design and (2) an STA tool configured to derate the each of the cells based on the corresponding cell-based voltage supply.

Another aspect provides a method of performing static timing analysis. In one embodiment, the method includes: (1) determining a cell-based voltage supply corresponding to each of a plurality of cells in an integrated circuit design and (2) derating the each of the cells based on the corresponding cell-based voltage supply.

Yet another aspect provides a design process optimization system for designing an integrated circuit employing adaptive voltage scaling (AVS). In one embodiment, the system includes: (1) a CVS tool configured to determine a cell-based voltage supply corresponding to each of a plurality of cells in an integrated circuit design, (2) PVT libraries configured to contain PVT libraries of PVT characterizations and (3) an STA tool configured to calculate a delay corresponding to each of the cells based on one of the PVT libraries and derate the each of the cells based on the corresponding delay and the corresponding cell-based voltage supply.

BRIEF DESCRIPTION

Reference is now made to the following descriptions taken in conjunction with the accompanying drawings, in which:

FIG. 1 illustrates a diagram of one embodiment of a system and method for carrying out STA with respect to a given IC design;

FIG. 2 is a graph showing a delay-to-voltage sensitivity distribution for a sample cell presenting a 6 pF load and a 2 ps slew;

DETAILED DESCRIPTION

Figure 3:
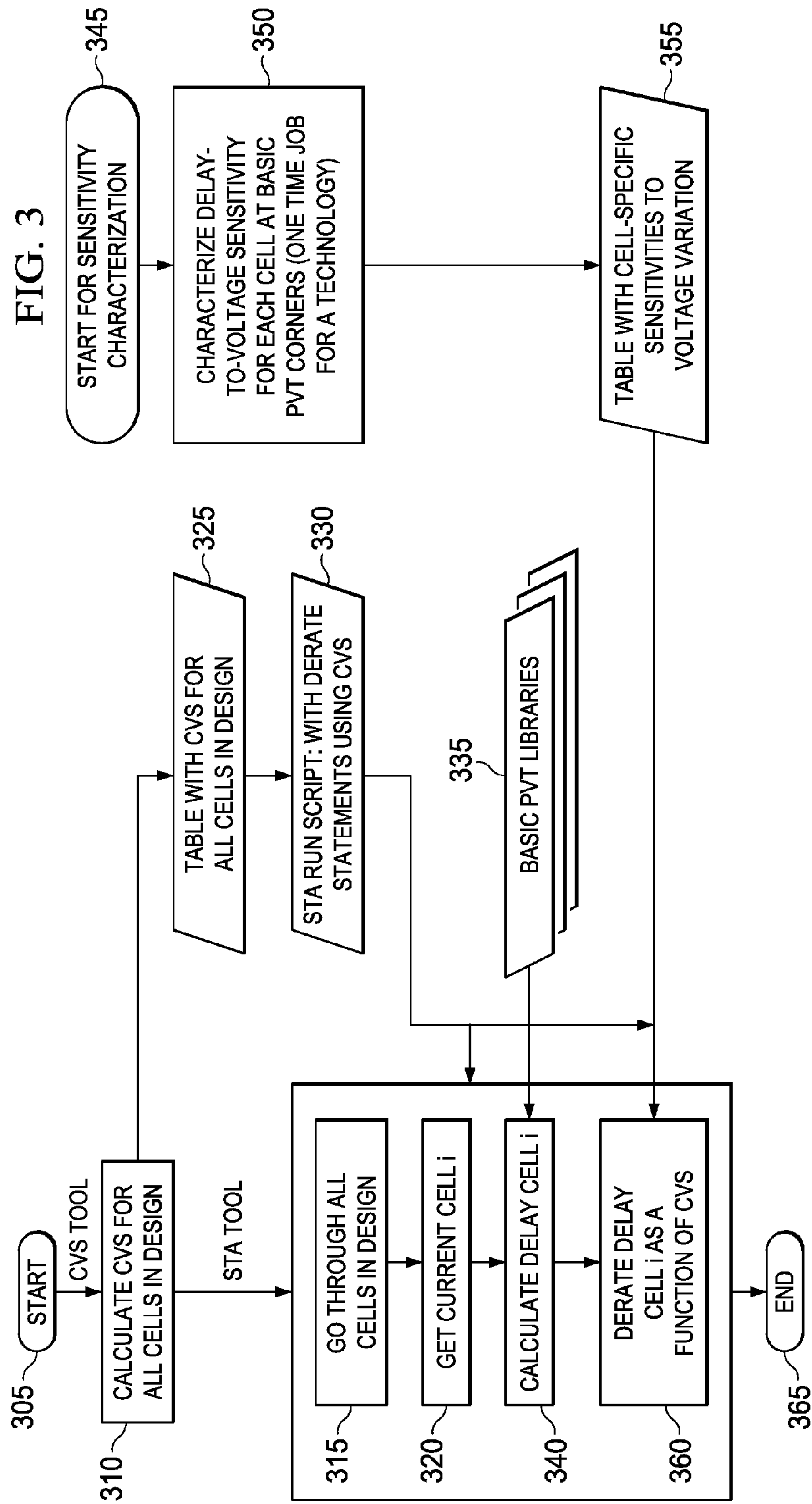
FIG. 3 illustrates a diagram of another embodiment of a system and method for carrying out STA with respect to a given IC design.

Described herein are various embodiments of a system and a method of timing signoff that takes into account static and dynamic voltage drop on at least some of the cells of a given IC design. The embodiments result in part from the discovery that voltage variations occurring within an IC are often the most significant factor impacting design timing.

Therefore, the system and method generally address a problem that has been found to be important during timing signoff, namely how static and dynamic voltage variations impact design timing and how these variations may be taken into account during static timing analysis (STA).

Conventional STA is carried out using an STA tool, which is a complex software application employed to simulate the operation of an IC design down to the cell level. The Synopsis Corporation of Mountain View, Calif., has developed an STA tool, called PrimeTime®, that circuit designers commonly use to perform STA. PrimeTime®, and other STA tools, have attempted to address this problem by voltage-scaling.

PrimeTime's approach to voltage-scaling only involves interpolating voltages from Composite Current Source (CCS) libraries at different voltages. Conventional STA with PrimeTime® at a given PVT corner involves first calculating the Cell-based (sometimes also called instance-based) Voltage Supply (CVS) for all cells in a given IC design.

CVS is the supply voltage that a particular cell (or "instance") encounters. CVS takes into account dynamic (also called AC or DVD) and static (also called DC or IR) voltage changes from the overall IC voltage supply, V_sup, employed to characterize the given PVT corner.

After calculating the CVS of all cells in a given IC design, the CCS library model for that cell is interpolated for each cell in the design using both basic libraries for the given PVT corner and additional PVT libraries with multiple voltages for the given PVT corner. A delay for that cell is then calculated as a function of the interpolated CCS model. STA can then be carried out with the delays thus calculated.

Unfortunately, one of the issues of PrimeTime's voltage-scaling approach is that circuit designers are required to have CCS libraries for two to three different voltages for each PVT corner. Not only do so many CCS libraries take substantial time to characterize and maintain, they also consume considerable computer storage. Consequently, even the largest circuit designers find it impractical to collect and process the data required for so many CCS libraries. To add to the issue, interpolating or scaling between or among multiple libraries inevitably introduces errors, decreasing the accuracy of the STA that is eventually performed.

In stark contrast to the conventional techniques just described, certain embodiments of the system and method described herein call for the delay of at least one cell in an IC design to be derated during timing signoff based on at least the CVS for that cell.

Some embodiments of the system and method call for the delay of at least one cell in an IC design to be derated based on the sensitivity of that cell's delay to at least voltage change, CVS and the voltage that is used in the delay library for a particular signoff corner at which the IC design's timing is being closed.

Most embodiments of the system and method provide a practical solution that can be deployed during timing signoff without disrupting the otherwise conventional timing closure process. Related embodiments of the system and method generally take into account only real voltage variations and reduced OCV margins and penalties on at least some cells in a given IC design. As a result, it is generally faster and easier to sign off designs, fix violations, minimize the number of additional cells needed for fixing hold violations, and design ICs.

In one embodiment of the system and method, the delay of each cell in a given IC design is derated using the following formula:

$$\text{Derating-factor}=1+S\_v(C)*[\text{CVS}(C)-V\_\text{corner}],$$

where S_v(C) is the delay-to-voltage sensitivity of a cell C, CVS(C) is the CVS of cell C, and V_corner is the voltage supply that was used to create the library for the given PVT corner at which STA is being carried out.

In another embodiment, the system and method are carried out in the context of a conventional timing signoff and employ novel scripts that cause otherwise conventional tools to cooperate in a novel manner. In yet another embodiment, the system and method cause CVS, which is a part of the IC design process associated with designing power supplies and interconnects, and timing closure, which is a part of the netlist IC design process to be carried out concurrently and cooperatively.

In still another embodiment, the system and method are readily carried out in any PVT corner where the timing of a particular IC design needs to be closed. In yet still another embodiment, the system and method may be used to carry out STA with respect to IC designs employing AVS. Those skilled in the pertinent art are familiar with AVS and its various advantages in terms of power consumption, speed and yield.

Having generally described various embodiments of the system and method introduced herein, specific embodiments of the system and method will now be illustrated and described in greater detail.

FIG. 1 illustrates a diagram of one embodiment of a system and method for carrying out STA with respect to a given IC design. FIG. 1 and many of the Figs. following it, are hybrid diagrams in the sense that they contain both components of a system and steps of a method.

FIG. 1 starts in a start step 105. In a step 110, CVS is calculated for all cells in a given IC design. In an alternative embodiment, CVS is calculated for fewer than all cells in a given IC design. In one embodiment, CVS is calculated using a conventional CVS tool, such as a Voltage Analysis Tool (VAT). Two examples of such a CVS tool or VAT are RedHawk® and CoolTime®, both commercially available from Apache Design Solutions of San Jose, Calif.

The output of the step 110, namely cell CVSs, is reported to an STA process in which all cells in the given design are analyzed in steps 115, 120. In a step 140, the delays of the cells are calculated using cell characterizations from basic PVT libraries 135. However, unlike conventional STA processes, the cell CVSs from the step 110 are also reported to a data structure 125 (e.g., a table). A script 130 calculates derating factors, namely the degrees to which the cells to be derated should be derated. Then, in a step 150, each cell to be derated is derated based on not only the derating factors provided by the script 130, but also PVT corner sensitivity to voltage variation data reported from a data structure 145 (e.g., a table). FIG. 1 ends in an end step 155.

Conventional VATs typically calculate cell CVS as a range [CVS_min, CVS_max], where CVS_min (the "worst voltage") is the lowest voltage to be encountered during STA, and CVS_max (the "best voltage") is the highest voltage during STA. Due to package resonance effects, CVS can sometimes be even higher than higher than V_corner. In such case, a signal may actually propagate faster than would be simulated in STA were voltage variation not taken into account. In one embodiment, the system and method of FIG. 1 employ CVS_min for STA.

The industry occasionally uses the term "cell voltage drop" to refer to cell voltage variations. CVD=CVS−V_sup, and CVS=V_sup+CVD. However, this term may be confusing, because cell voltage variation may result in a rise as well as a drop. It would be more accurate to refer to a cell voltage variation or change instead of a CVD.

The voltage at which a particular IC is driven may not necessarily be the nominal voltage V_nom (e.g., 0.9V for the 40 nm technology), although it often is. For most 40 nm IC designs, V_nom is set at 0.9V. However, it may legitimately be set at some other voltage, e.g., 0.94V. If CVD is set at, e.g., 15%, drop (a possible voltage spec; it is 0.135V at a V_nom of 0.9V.

In the illustrated embodiment, only V_nom is used to calculate the voltage supply used for characterization at a given PVT corner. For example, if i denotes the $i^{th}$ cell in a given IC design and V_nom=0.9V and V_sup=V_nom=900 mv, a VAT reports CVS(i)=800 mV, CVD(i)=−100 mV. If V_nom=0.9V and V_sup=V_nom=900 mv, a VAT reports CVS(i)=950 mV, CVD(i)=+50 mV. As yet another example, if V_wc=V_nom−10%=0.81V, a VAT reports CVS(i)=780 mV, CVD(i)=−30 mV. As yet another example, if V_wc=V_nom−10%=0.81V, a VAT reports CVS(i)=810 mV, CVD(i)=+10 mV.

VAT-estimated CVSs may contain errors arising from differences between the simulations of ICs that yield PVT corner libraries and real-world, operating ICs. If E_CVS is an error in CVSs a VAT reports, it may be described as a mean error, E_CVS_mean, which may be positive or negative, and a (typically three-sigma) variation E_CVS_var, expressed in mV. "On-chip variation" (OCV) margins should cover these errors. Assuming the VAT is used correctly (with an accurate activity), errors in the results reported by the VAT are usually small. Typical errors can be described as E_CVS_mean=0 (or 0%), and E_CVS_var=0.03 (or 3%). These errors may be synchronized with accuracy data for other EDA tools.

As stated above, S_v(C) is the delay-to-voltage sensitivity of a cell C. S_v is typically expressed as a rate of cell delay change given a 1 mV voltage change. It is a negative number because cell delay and voltage negatively correlate. For example, if S_v=−0.0027, the cell delay will increase 0.27% as voltage drops by 1 mV and will decrease 0.27% as voltage increases by 1 mV.

It cannot be assumed, however, that all cells in a given IC design have the same S_v. In one embodiment, the system and method employ the maximum absolute value of sensitivity across all cells of a given IC design and PVT corner, resulting in conservative results. In a related embodiment, the system and method employ a different S_v for each PVT corner. In one specific embodiment, the system and method employ a smaller S_v for a best PVT corner (S_v_bc), indicating less conservatism, and a larger S_v for a worst PVT corner (S_v_wc), indicating greater conservatism. With these, certain embodiments of the system and method then factor in sensitivities that are individual for each cell type.

Irrespective of the above, it has been found unlikely that all cells in a path will have extreme sensitivities. See FIG. 2, which shows a delay-to-voltage sensitivity distribution for a sample cell presenting a 6 pF load and a 2 ps slew. FIG. 2 resulted from a simulation showing that S_v has a distribution close to normal with a mean value M_s_v=−0.0015 and a variation (3 sigma) V_s_v=0.0015. Given this, statistical cell sensitivity in a path with N stages is given by S_v_s=M_s_v−V_s_v/sqrt(N). Again, the negative sign is appropriate because sensitivity is negative. If the average path of a given IC design has N=9 stages, the final statistical cell sensitivity is S_v_s=−0.002. This statistical approach allows excess conservatism to be reasonably reduced.

To improve accuracy (or reduce uncertainty) certain embodiments of the system and method are enhanced by precharacterizing cells and using the resulting data (stored in a data structure such as a table) during STA instead of library-specific (PVT-specific) sensitivity (as the table 145 in FIG. 1 signified). These embodiments do have some uncertainty in that the sensitivity calculation assumes a certain load and slew. However, this uncertainty is not only typically relatively small but also less than library-specific sensitivity, which is assumed in the library to be the same for all cells.

FIG. 3 illustrates a diagram of another embodiment of a system and method for carrying out STA with respect to a given IC design. FIG. 3 specifically illustrates a system and method that take CVD into account.

FIG. 3 starts in a start step 305. In a step 310, CVS is calculated for all cells in a given IC design. In an alternative embodiment, CVS is calculated for fewer than all cells in a given IC design. The output of the step 310, namely cell CVSs, is reported to an STA process in which all cells in the given design are analyzed in steps 315, 320. In a step 340, the delays of the cells are calculated using cell characterizations from basic PVT libraries 335. Like FIG. 1, the cell CVSs from the step 310 are also reported to a data structure 325 (e.g., a table). A script 330 calculates derating factors, namely the degrees to which the cells to be derated should be derated.

Cell sensitivity (S_v) characterization begins in a step 345. In a step 345, S_v is characterized for each cell to be derated. As FIG. 2 indicates, this is common to IC designs realized in the same IC technology and need not be done more than once for a particular technology. The results of the step 345 are stored in a data structure (e.g., a table 355). Each cell to be derated is then derated in a step 360 based on not only the derating factors provided by the script 330, but also the S_v data reported from the data structure 355. FIG. 3 ends in an end step 365.

In the illustrated embodiment, Table 1 sets forth statements, expressed in PrimeTime® script, that may be used to generate cell derate factors:

TABLE 1

| Sample PrimeTime ® Script |
|---|
| set_timing_derate-cell_delay-late <OCV_corner_late_final + S_v_s_corner *((CVS_min(i) −V_corner) *1e3)> [get_cells <instance i>] |
| set_timing_derate-cell_delay-early <OCV_corner_early_final + S_v_s_corner *(CVS_max(i) −V_corner) *1e3)> [get_cells <instance i>] |

To minimize the risk of underestimating the effect of voltage variation on cell delay, the first statement of Table 1 employs CVS max for "delay-early" (because it is the highest voltage encountered during simulation), and the second statement of Table 1 employs CVS min for "delay-late," because it is the lowest voltage during the simulation.

Figure 4:
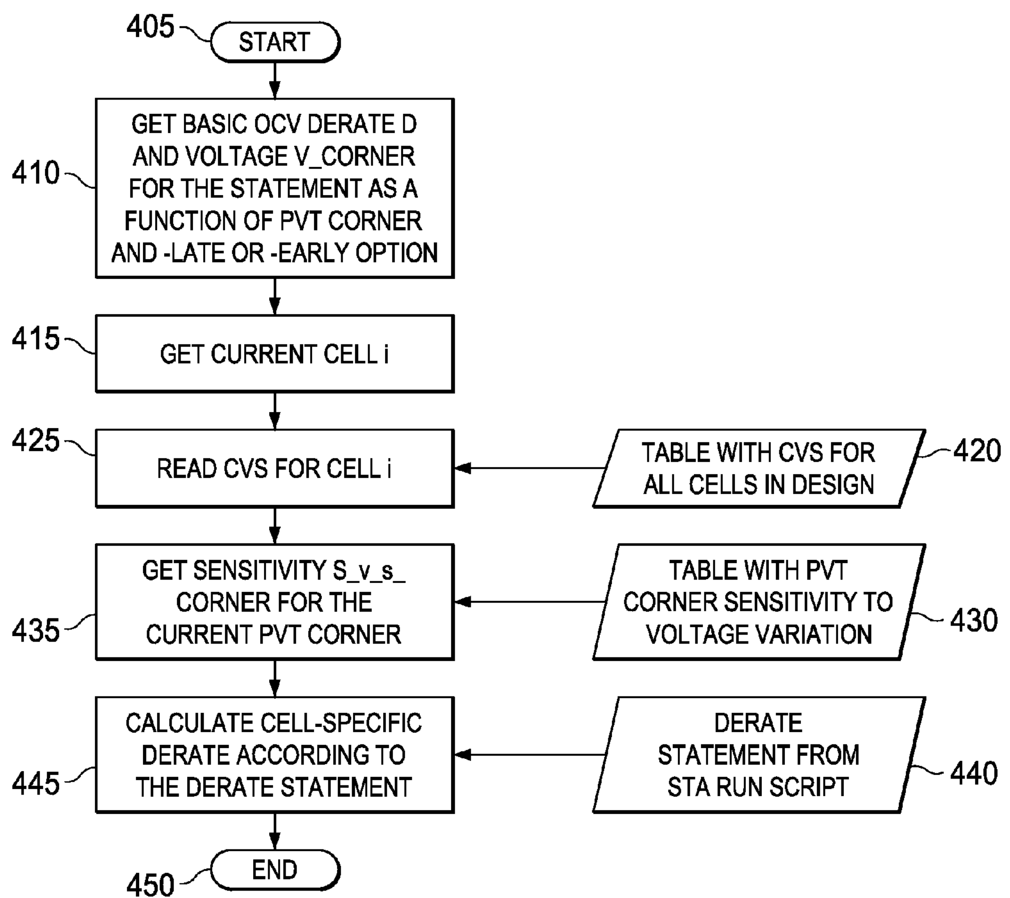
FIG. 4 illustrates a diagram of yet another embodiment of a system and method for carrying out STA with respect to a given IC design.

FIG. 4 illustrates a diagram of yet another embodiment of a system and method for carrying out STA with respect to a given IC design. FIG. 4 illustrates of how the above derate statements scale the cell delay using OCV.

FIG. 4 starts in a start step 405. In a step 410, basic derate data D and V_corner voltage (corresponding to the _

PVT corner at which STA is being carried out for a given design) are obtained for the set timing derate-cell delay-late and set timing derate-cell delay-early statements. (S_v_s corner is the statistical voltage sensitivity for the corner. For the 40 nm technology, S_v s_wc=−0.002 and S_v_s_bc=−0.0015.) Then, for each of the cells to be derated (iterated in a step 415) in the given design, the CVS for each of the cells is obtained from a data structure 420 (e.g., a table) containing CVS values for all cells in the given IC design in a step 425. Then, the cell-specific sensitivity to voltage variation (S_v) for each of the cells is obtained from a data structure 430 containing PVT corner sensitivity to voltage variation in a step 435. Finally, the degree by which each cell to be derated is derated is calculated in a step 545 using derate statements, e.g., as contained in the script of Table 1, above.

Figure 5:
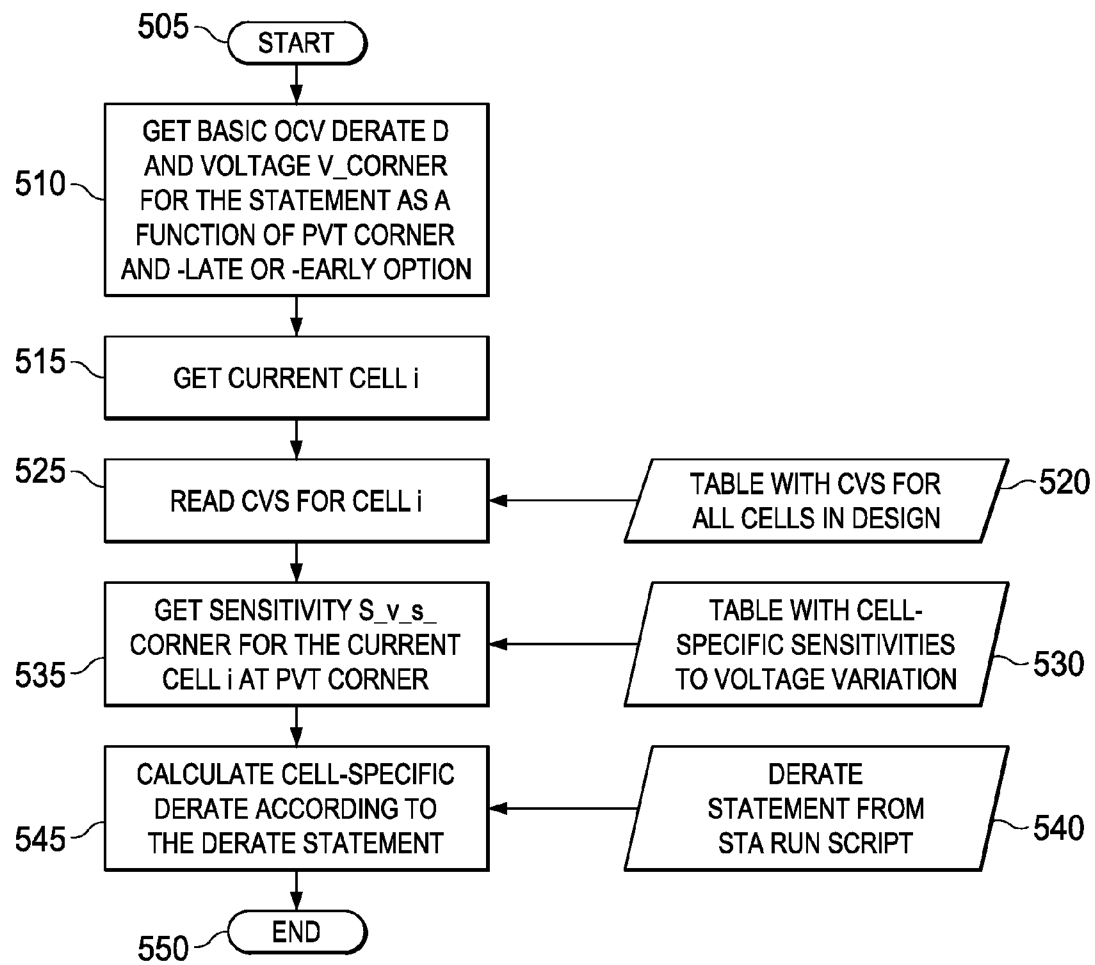
FIG. 5 illustrates a diagram of still another embodiment of a system and method for carrying out STA with respect to a given IC design.

In the system and method of FIG. 5, the "statistical" sensitivity of the PVT corner is used. The notation "_corner" signifies that the S_v_s_corner corresponds to the voltage of the PVT corner, or, more precisely, to the voltage of the library used in the STA for the corner. Further, the term S_v_s_corner*(CVS(i)−V_corner) *1e3 corresponds to the change in derate (OCV margin) for each cell i due to cell-based voltage change. CVS(i) is CVS for cell i. The derate statements employed in the system and method of FIG. 4 essentially override the default (global) derate factor (i.e., the OCV margin).

In the embodiment of FIG. 4, OCV_mode_corner is a global OCV derate for the corner that was estimated without taking into account voltage variations and CVS error. As an example, for the 40 nm technology: OCV_wc_late=1.02 (or 2% OCV margin), OCV_wc_early=0.098 (or 2% OCV margin), OCV_bc _late=1.035 (or 3.5% OCV margin), and OCV be early=0.965 (or 3.5% OCV margin). E_CVS_mean is the mean error of the VAT and assumed to equal 0.00 for the 40 nm technology. E_CVS_var is the three-sigma error of the VAT and assumed to equal 0.03 for the 40 nm technology.

In one embodiment, the above OCV corner derate factors are adjusted to take into account E_CVS error. The CVS error can be converted to a cell delay derate factor as: d_CVS_late≈−S_v_corner*(V_nom*(E_CVS_mean+K*E_CVS_var))*1e3 d_CVS_early≈−S_v_corner*(V_nom*(E_CVS_mean−K*E_CVS_var))*1e3, where K is a safety multiplier (K<1). If K=0.33, one sigma of error will be “added” to the derate factor. As K increases, the derate factor becomes more conservative. For 40 nm PVT corners (assuming K=0.33): d_CVS_late_wc≈0.002*(0.9*(0+0.01))*1e3=0.009, d_CVS_early_wc≈0.002*(0.9*(0−0.01))*1e3=−0.009, d_CVS_late_bc≈0.0015*(0.9*(0+0.01))*1e3=0.00675, and d_CVS_early_bc≈0.0015*(0.9*(0−0.01))*1e3=−0.00675.

The above error can be statistically added to OCV_corner global OCV, viz.: OCV_corner_late_final=(OCV_corner_late2+d_CVS_late_corner2) OCV_corner_early_final=(OCV_corner_early2−d_CVS_early_corner2). The final OCV for the 40 nm technology becomes: OCV_wc_late_final=1.022, OCV_wc_early_final=0.979, OCV_bc_late_final=1.036, and OCV_bc_early_final=0.9626. CVS_i is the CVS (expressed in V) for cell i reported by the VAT for the given PVT corner.

Those skilled in the pertinent art will understand that the VAT should be run with the correct external voltage supply. For example, if the IC design in question employs AVS, and V_nom+10% is used for slow chips, V_nom+10% should be used for calculating CVS voltages in the worst PVT corner.

If cell-specific sensitivities are pre-characterized for each corner, the cell-derate factor is given by the following statements in Table 2, below:

TABLE 2

| Sample PnmeTime ® Script |
|---|
| set__timing__derate –cell__delay –late <OCV__corner__late__final + S__v__s__corner(i) *((CVS__min(i) – V__corner) *1e3)> [get__cells <instance i>]<br>set__timing__derate –cell__delay –early <OCV__corner__early__final + S__v__s__corner(i) *(CVS__max(i)¬V__corner)*1e3)> [get__cells <instance i>] |

In Table 2, S v s corner(i) is the sensitivity for cell i (more precisely, for the cell type of instance i), taken from a data structure of cell sensitivities.

FIG. 5 illustrates a diagram of still another embodiment of a system and method for carrying out STA with respect to a given IC design. FIG. 5 illustrates of how the above derate statements may be employed to scale the cell delay.

FIG. 5 starts in a start step 505. In a step 510, basic derate data D and V corner voltage (corresponding to the PVT corner at which STA is being carried out for a given design) are obtained for the set timing derate-cell delay-late and set timing derate-cell delay-early statements. Then, for each of the cells to be derated (iterated in a step 515) in the given design, the CVS for each of the cells is obtained from a data structure 520 (e.g., a table) containing CVS values for all cells in the given IC design in a step 525. Then, the cell-specific sensitivity to voltage variation (S_v) for each of the cells is obtained from a data structure 530 containing S_v for all cells in the given IC design in a step 535.

Figure 6:
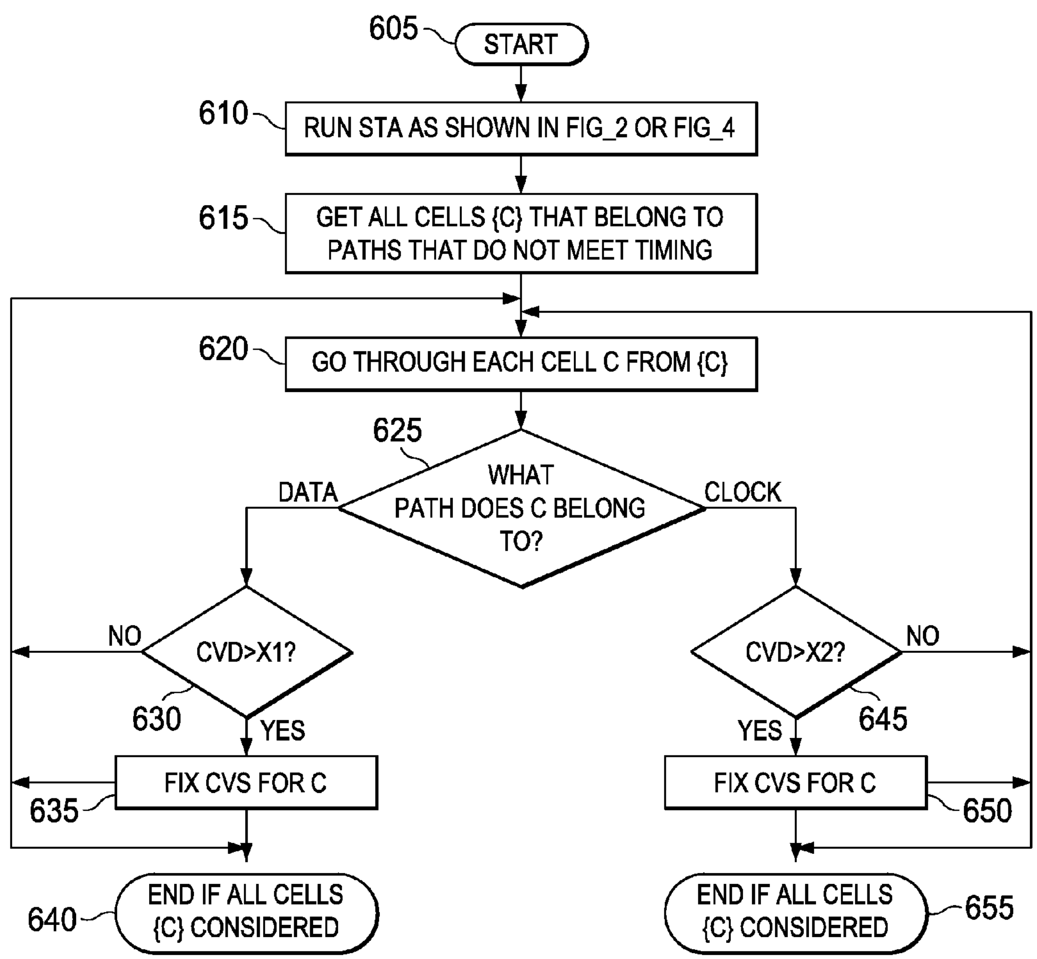
FIG. 6 illustrates a diagram of still yet another embodiment of a system and method for carrying out STA with respect to a given IC design.

Given the above-described embodiments, timing violations may be repaired in different embodiments. In one embodiment, timing violations may be repaired by improving cell CVS (minus CVD). FIG. 6 shows a flow diagram of a method for this approach. The method begins in a start step 605. In a step 610, an STA is performed, e.g., as described in FIG. 1 or 3. In a step 615, a list of cells belonging to paths that fail STA is assembled. The list is then analyzed, cell by cell, in a step 620. In a decisional step 625, it is determined whether the cell in question belongs to a data path (i.e., a data cell) or a clock path (i.e., a clock cell). As the steps 630, 635 indicate, any data cell in the list that has a CVD>X1% (for example, X1=10%) should be considered for a fix (a CVS reduction). As the steps 645, 650 indicate, any clock cell in the list that has a CVD>X2% (for example, X2=8%) and belongs to a launch clock path should be considered for a fix (a CVS reduction). The method ends when all data cells and clock cells are considered (in steps 640, 655).

Figure 7:
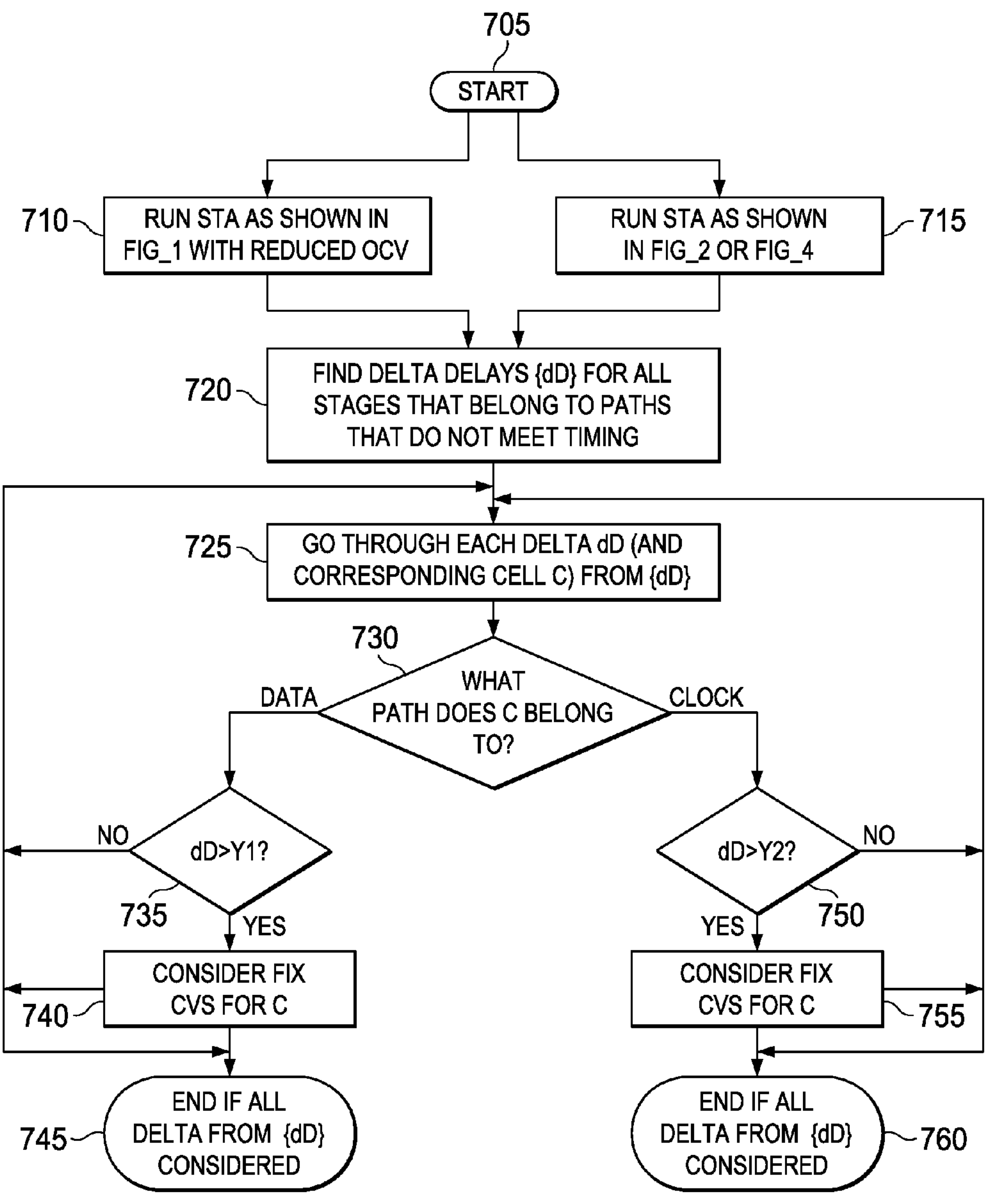
FIG. 7 illustrates a diagram of yet still another embodiment of a system and method for carrying out STA with respect to a given IC design.

In another embodiment, timing violations may be repaired by improving differences in delays of stages. FIG. 7 shows a flow diagram of a method for this approach. The method begins in a start step 705. In a step 710, an STA is performed, e.g., as described in FIG. 1, but with a reduced OCV, in a step 710). Alternatively, an STA is performed as described in FIG. 2 or 4, in a step 715). In a step 720, a list of delta delays, dD, for all stages belonging to paths that fail STA is assembled. The list is then analyzed, cell by cell, in a step 725. In a decisional step 730, it is determined whether the cell in question belongs to a data path (i.e., a data cell) or a clock path (i.e., a clock cell). As the steps 735, 740 indicate, any data cell in the list that has a dD>Y1 (for example, Y=10 ps) should be considered for a fix (a CVS reduction). As the steps 750, 755 indicate, any clock cell in the list that has a dD>Y2 (for example, Y=8 ps) and belongs to a launch clock path should be considered for a fix (a CVS reduction). The method ends when all data cells and clock cells are considered (in steps 745, 760).

The example PrimeTime® script of Table 3, below, is an illustration and can be used to find all cells with CVD>10%. By running the script with and without taking the CVD effect into account, one can understand the impact of CVD on slack. Since the number of cells in violating paths with a CVD >X % (e.g., 10%) or dD>Y (e.g., 10 ps) is likely to be relatively small, the example PrimeTime® script of Table 3, below, can be executed and repeated as needed.

TABLE 3

Sample PrimeTime ® Script

```
set cells [get__cells {
blk1/inst1
blk2/inst2
}]
foreach__in__collection cell $cells {
      echo [get__attribute $cell full__name]
      set paths [get__timing__path –through [get__pin –of $cell –
filter direction==out ] ]
      foreach__in__collection path $paths {
            echo –n “\t” [get__attribute [get__attribute $path
endpoint] full__name]
            echo “\t” [get__attribute $path slack]
      }
}
```

The example PrimeTime® script of Table 3 can be modified to create a script that: (1) considers cells only in paths that are violating (have negative or zero slack), or considers only cells that belong to data paths and launch clock paths, considers only cells with relatively large CVD or dD.

Flip-flops and clock cells (e.g., buffers or inverters) may have stricter timing requirements. For example, each flip-flop with a CVD>X3% should probably be fixed, because of an uncertainty in voltage-induced setup/hold time that PrimeTime® does not model. Also, each clock cell with a CVD>X4% should probably be fixed, because it may induce excessive clock jitter, the impact of which may be much more significant than just a simple delay impact in timing. The script of Table 3 may be used as a starting point for developing scripts for fixing violating paths and fixing flip-flop and clock cells.

Table 4, below, gives an example of the output report of the script of Table 3, above.

TABLE 4

| Example of PrimeTime ® Script Output | |
|---|---|
| blk2/inst2 | |
| blk2/reg3/D | −128.543 |
| blk2/reg4/ D | 57.4821 |
| blk1/inst1 | |
| blk1/reg5/D | −17.5165 |
| blk1/reg6//D | −94.436 |

As is evident from an examination of Table 4, the output report includes all cells with CVD>10%. For each cell (such as "right2__6/DIMM5_DQ__17_BCELL/U5"), the script output reports the receiving flip-flop (such as "right2__6/DIMM5_DQ__17_BCELL/retimeElem_reg/D" and corresponding slack.

Those skilled in the art to which this application relates will appreciate that other and further additions, deletions, substitutions and modifications may be made to the described embodiments.

What is claimed is:

1. A system for performing static timing analysis, comprising:
- a CVS tool configured to determine a cell-based voltage supply corresponding to each of a plurality of cells in an integrated circuit design; and
- an STA tool configured to derate a timing of said each of said cells based on said corresponding cell-based voltage supply;
- wherein said tools are embodied in program code stored in a non-transitory computer readable storage medium, said program code executed by a computer.

2. The system as recited in claim 1 wherein said STA tool is further configured to derate said each of said cells based on a sensitivity of a delay of said each of said cells to a change in said corresponding cell-based voltage supply.

3. The system as recited in claim 1 wherein said STA tool is further configured to derate said each of said cells based on a voltage used in a delay library for a particular signoff corner.

4. The system as recited in claim 1 wherein said STA tool is further configured to derate said each of said cells based on real voltage variations.

5. The system as recited in claim 1 wherein said STA tool is further configured to derate said each of said cells based on reduced on-chip variation margins.

6. The system as recited in claim 1 further comprising a script executable to cause said STA tool to derate said each of said cells, said script including at least one statement defining a derating factor.

7. The system as recited in claim 1 wherein said integrated circuit design employs adaptive voltage scaling.

8. A method of performing static timing analysis, comprising:
- determining a cell-based voltage supply corresponding to each of a plurality of cells in an integrated circuit design; and
- derating a timing of said each of said cells based on said corresponding cell-based voltage supply;
- wherein said method is executable by a computer.

9. The method as recited in claim 8 wherein said derating comprises derating said each of said cells based on a sensitivity of a delay of said each of said cells to a change in said corresponding cell-based voltage supply.

10. The method as recited in claim 8 wherein said derating comprises derating said each of said cells based on a voltage used in a delay library for a particular signoff corner.

11. The method as recited in claim 8 wherein said derating comprises derating said each of said cells based on real voltage variations.

12. The method as recited in claim 8 wherein said derating comprises derating said each of said cells based on reduced on-chip variation margins.

13. The method as recited in claim 8 further comprising executing a script to carry out said derating of said each of said cells, said script including at least one statement defining a derating factor.

14. The method as recited in claim 8 wherein said integrated circuit design employs adaptive voltage scaling.

15. A design process optimization system for designing an integrated circuit employing adaptive voltage scaling, comprising:
- a CVS tool configured to determine a cell-based voltage supply corresponding to each of a plurality of cells in an integrated circuit design;
- process-voltage-temperature (PVT) libraries configured to contain PVT libraries of PVT characterizations; and
- an STA tool configured to calculate a delay corresponding to each of said cells based on one of said PVT libraries and derate a timing of said each of said cells based on said corresponding delay and said corresponding cell-based voltage supply;
- wherein said tools are embodied in program code stored in a non-transitory computer readable storage medium, said program code executed by a computer.

16. The system as recited in claim 15 wherein said STA tool is further configured to derate said each of said cells based on a sensitivity of a delay of said each of said cells to a change in said corresponding cell-based voltage supply.

17. The system as recited in claim 15 wherein said STA tool is further configured to derate said each of said cells based on a voltage used in a delay library for a particular signoff corner.

18. The system as recited in claim 15 wherein said STA tool is further configured to derate said each of said cells based on real voltage variations.

19. The system as recited in claim 15 further comprising a script executable to cause said STA tool to derate said each of said cells, said script including at least one statement defining a derating factor.

20. The system as recited in claim 15 wherein said STA tool is further configured to derate said each of said cells based on reduced on-chip variation margins.

* * * * *